(12) United States Patent
Juni et al.

(10) Patent No.: US 7,546,003 B2
(45) Date of Patent: Jun. 9, 2009

(54) SUSPENSION BOARD WITH CIRCUIT AND PRODUCING METHOD THEREOF

(75) Inventors: Noriyuki Juni, Osaka (JP); Kazunori Mune, Osaka (JP); Sazzadur Rahman Khan, Osaka (JP); Toshiki Naito, Osaka (JP); Yutaka Aoki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 27 days.

(21) Appl. No.: 11/984,733

(22) Filed: Nov. 21, 2007

(65) Prior Publication Data

US 2008/0115962 A1    May 22, 2008

(30) Foreign Application Priority Data

Nov. 21, 2006  (JP) ............................. 2006-314149
Jul. 31, 2007  (JP) ............................. 2007-199996

(51) Int. Cl.
   *G02B 6/12*    (2006.01)
   *H01L 21/00*   (2006.01)
   *B23B 5/28*    (2006.01)

(52) U.S. Cl. ............................. 385/14; 385/15; 385/31; 385/130; 385/131; 438/29; 438/31; 369/44.12; 369/43; 29/829; 174/250

(58) Field of Classification Search .................. 385/14, 385/15, 24, 12, 27, 37, 38, 39, 88, 89, 92, 385/130, 129, 131, 132; 369/13.3, 13.33, 369/13.34, 13.36, 43, 44.11, 44.12, 44.16, 369/44.17, 44.19, 112.01, 112.09, 112.27, 369/258.1; 174/250; 29/829; 438/29, 31

See application file for complete search history.

(56) References Cited

U.S. PATENT DOCUMENTS

| | | | |
|---|---|---|---|
| 5,910,012 A * | 6/1999 | Takeuchi ..................... | 438/31 |
| 6,016,290 A | 1/2000 | Chen et al. .................... | 369/13 |
| 7,106,664 B2 * | 9/2006 | Hasegawa et al. .......... | 369/13.33 |
| 7,154,820 B2 * | 12/2006 | Nakada et al. ............. | 369/13.32 |
| 2002/0167870 A1 | 11/2002 | Akiyama et al. ............ | 369/13.33 |
| 2004/0008605 A1 * | 1/2004 | Thornton et al. ........ | 369/112.27 |
| 2004/0131001 A1 * | 7/2004 | Nakada et al. .......... | 369/112.27 |
| 2005/0018547 A1 | 1/2005 | Akiyama et al. .......... | 369/13.02 |
| 2006/0133230 A1 * | 6/2006 | Buechel et al. ........... | 369/44.23 |
| 2006/0233061 A1 | 10/2006 | Rausch et al. ............. | 369/13.32 |
| 2006/0233062 A1 | 10/2006 | Bedillion et al. .......... | 369/13.32 |

FOREIGN PATENT DOCUMENTS

| | | | | |
|---|---|---|---|---|
| EP | 1 635 624 A2 | 3/2006 | ............... | 369/13 X |
| JP | 2000-195002 | 7/2000 | ............... | 369/13 X |
| JP | 2002-169064 | 6/2002 | ............... | 369/13 X |
| JP | 2002-298302 | 10/2002 | ............... | 369/13 X |
| JP | 2006-323908 | 11/2006 | ............... | 369/13 X |
| JP | 2007-094296 | 4/2007 | ............... | 369/13 X |
| JP | 2007-095167 | 4/2007 | ............... | 369/13 X |
| WO | WO 2004-001724 A1 | 12/2003 | ............... | 369/13 X |

* cited by examiner

*Primary Examiner*—Brian M Healy
(74) *Attorney, Agent, or Firm*—Jean C. Edwards, Esq.; Akerman Senterfitt

(57) ABSTRACT

A suspension board with circuit includes a metal supporting board, an insulating base layer formed on the metal supporting board, a conductive pattern formed on the insulating base layer, an insulating cover layer formed on the insulating base layer so as to cover the conductive pattern, and an optical waveguide.

6 Claims, 7 Drawing Sheets

1

SUSPENSION BOARD WITH CIRCUIT AND PRODUCING METHOD THEREOF

CROSS-REFERENCE TO RELATED APPLICATION

The present application claims priority from Japanese Patent Application No. 2006-314149 filed on Nov. 21, 2006, and also claims priority from Japanese Patent Application No. 2007-199996 filed on Jul. 31, 2007, the content of each of which is hereby incorporated by reference in their entirety.

BACKGROUND OF THE INVENTION

1. Field of the Invention

The present invention relates to a suspension board with circuit and a producing method thereof. More particularly, the present invention relates to a suspension board with circuit mounted on a hard disk drive which adopts an optical assist system, and a producing method thereof.

2. Description of the Related Art

In recent years, an optical assist system (optical assist magnetic recording system) has been known as a magnetic recording system for a hard disk drive or the like that is capable of recording information at high density in a small recording magnetic field by heating a hard disk drive under light irradiation during recording of information, and then recording the information with a magnetic head in a state where the coercive force of the hard disk is reduced.

There has been proposed that, for example, in an optical assist magnetic recording apparatus adopting the optical assist system, a magnetic recording/reproducing device is provided by forming a magnetic reproducing element and a magnetic recording element (magnetic head), an optical waveguide, and a light source on a side surface of a head slider, and the head slider is supported by a suspension (cf. Japanese Unexamined Patent Publication No. 2000-195002).

SUMMARY OF THE INVENTION

However, the head slider is formed relatively small to satisfy the need for miniaturization, and is also provided with the magnetic head, so that it is difficult to install any other components on the head slider because of the limited space. Therefore, when the optical waveguide and the light source both used in the optical assist system are provided on the head slider together with the magnetic head, the layout is limited, so that the production is time-consuming and troublesome, resulting in increase in production cost.

It is an object of the present invention to provide a suspension board with circuit and a producing method thereof capable of ensuring freedom of design while allowing to adopt an optical assist system, improving production efficiency, and achieving reduction of production cost.

The suspension board with circuit of the present invention comprises a metal supporting board, an insulating base layer formed on the metal supporting board, a conductive pattern formed on the insulating base layer, an insulating cover layer formed on the insulating base layer so as to cover the conductive pattern, and an optical waveguide.

In the suspension board with circuit of the present invention, it is preferable that the optical waveguide is provided on the insulating base layer or the insulating cover layer.

In the suspension board with circuit of the present invention, it is preferable that the optical waveguide comprises an under clad layer, a core layer formed on the under clad layer and having a higher refractive index than that the under clad layer, and an over clad layer formed on the under clad layer so as to cover the core layer and having a lower refractive index than that of the core layer, and the insulating base layer also serves as the under clad layer, the core layer is formed on the insulating base layer, and the insulating cover layer also serves as the over clad layer.

It is preferable that the suspension board with circuit of the present invention further comprises a light emitting device, wherein the light emitting device is optically connected to the optical waveguide.

It is preferable that the suspension board with circuit of the present invention comprise a mounting portion for mounting a head slider, wherein an opening penetrating the metal supporting board in a thickness direction is formed in the vicinity of the mounting portion, and the optical waveguide is formed with one end connected to the light emitting device and the other end facing the opening.

In the suspension board with circuit of the present invention, it is preferable that the optical waveguide is arranged along a direction in which the conductive pattern extends, the light emitting device is arranged on lengthwise one side in the lengthwise direction of the metal supporting board, and the mounting portion is arranged on the other side in the lengthwise direction of the metal supporting board.

In the suspension board with circuit of the present invention, the optical waveguide used in the optical assist system can be formed with more sufficient space than the head slider. This allows to ensure freedom of design, improve production efficiency, and achieve reduction of production cost.

The method for producing a suspension board with circuit according to the present invention comprises the steps of preparing a metal supporting board, and forming an insulating base layer formed on the metal supporting board, forming a conductive pattern formed on the insulating base layer, and forming an insulating cover layer formed on the insulating base layer so as to cover the conductive pattern, forming an optical waveguide on the insulating base layer or the insulating cover layer, forming an opening penetrating the metal supporting board in the thickness direction in the vicinity of a mounting portion for mounting a head slider, and cutting the insulating base layer and/or the insulating cover layer and the optical waveguide and the optical waveguide from a side of the opening such that an end face of the optical waveguide intersects a direction in which the optical waveguide extends.

The method for producing a suspension board with circuit according to the present invention includes the steps of preparing a metal supporting board, forming an insulating base layer also serving as an under clad layer on the metal supporting board, forming a conductive pattern on the insulating base layer, forming a core layer having a higher refractive index than that of the insulating base layer on the insulating base layer, and forming an insulating cover layer also serving as an over clad layer and having a lower refractive index than that of the core layer on the insulating base layer so as to cover the conductive pattern and the core layer.

According to the method for producing the suspension board with circuit of the present invention, the optical waveguide used in the optical assist system can be formed on the insulating base layer or the insulating cover layer while having more sufficient space than the head slider. Therefore, freedom of design can be ensured. Besides, the insulating base layer and/or the insulating cover layer, and the optical waveguide are cut at a time from the opening side, so that a light emitted from the optical waveguide can be reliably applied toward a desired position, and at the same time, the suspension board with circuit can be simply and quickly produced. Thus, production efficiency can be improved and reduction of production cost can also be achieved.

Further in the suspension board with circuit and the producing method thereof according to the present invention, when the suspension board with circuit is formed so that the insulating base layer also serves as the under clad layer and the insulating cover layer also serves as the over clad layer, the suspension board with circuit can be made thinner, the construction thereof can be simplified, and the production man hour can be reduced, resulting in improvement of production efficiency and cost reduction.

DETAILED DESCRIPTION OF THE INVENTION

Figure 1:
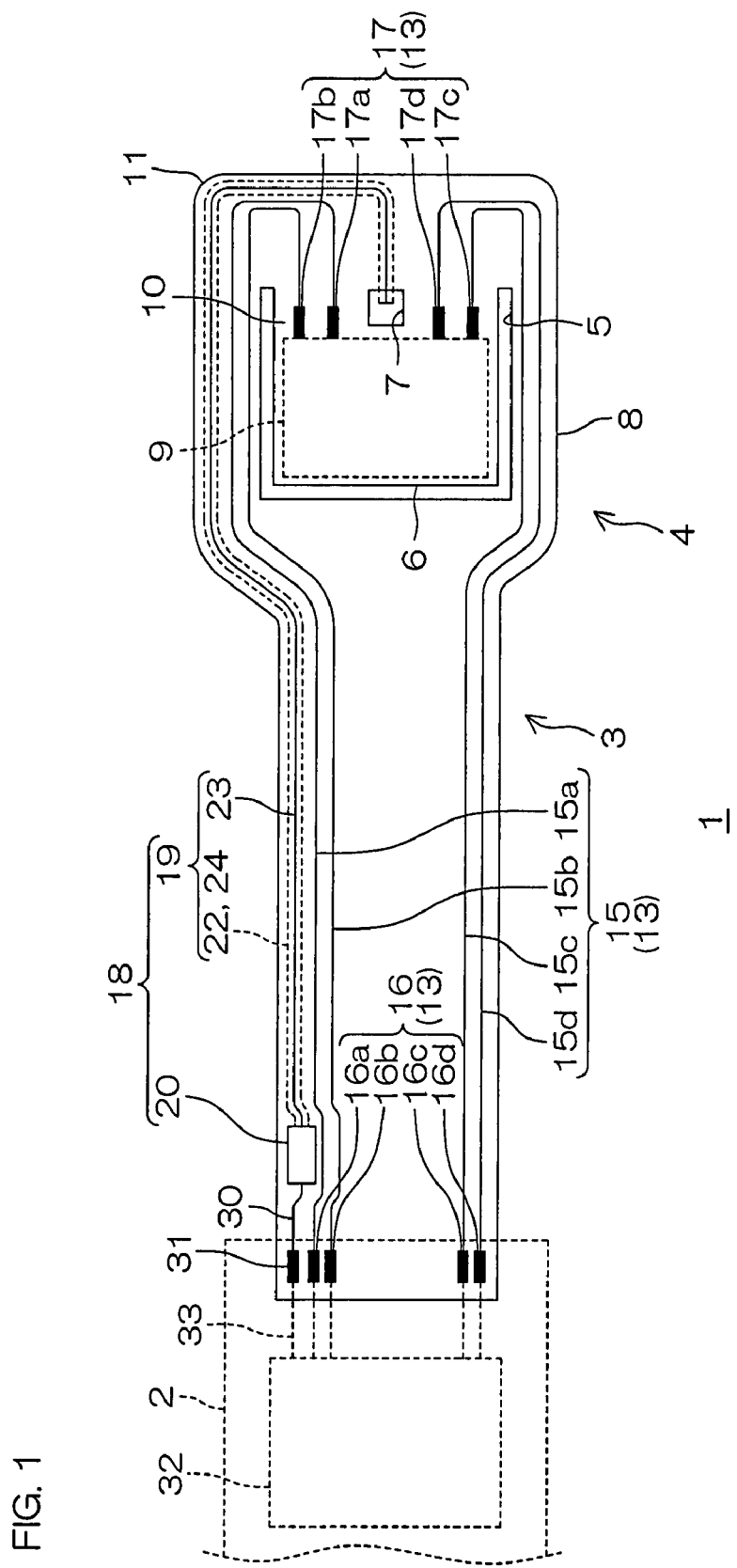
FIG. 1 is a plan view illustrating a suspension board with circuit of an embodiment according to the present invention.
Figure 2:
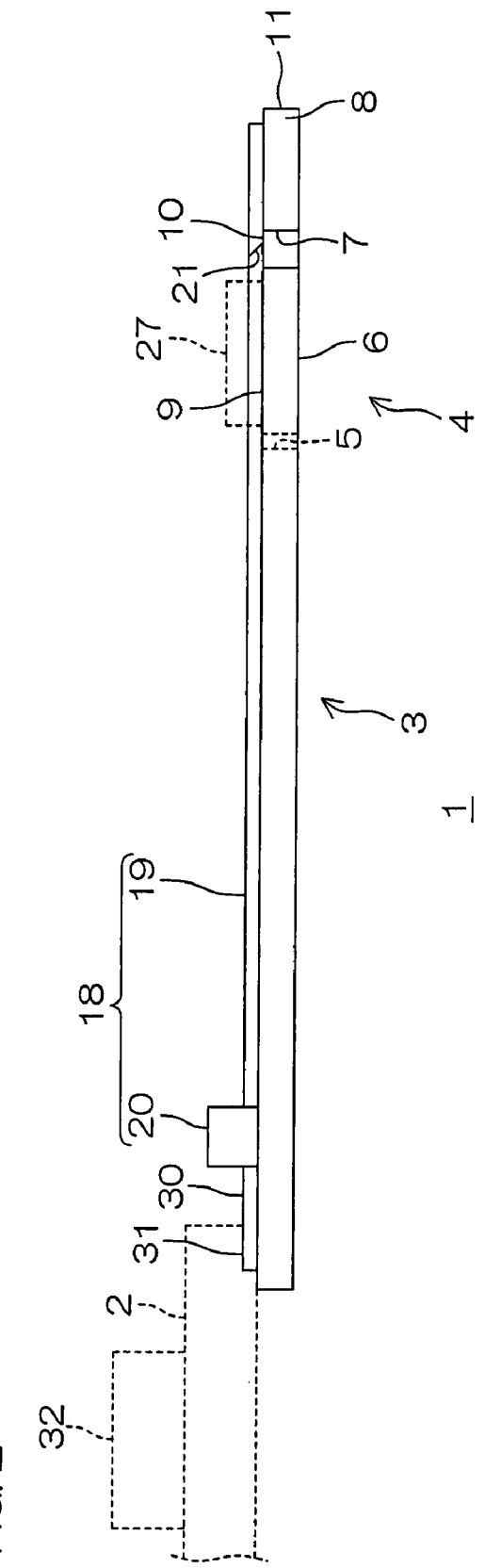
FIG. 2 is a sectional view of the suspension board with circuit shown in FIG. 1 taken along an optical waveguide.
Figure 3:
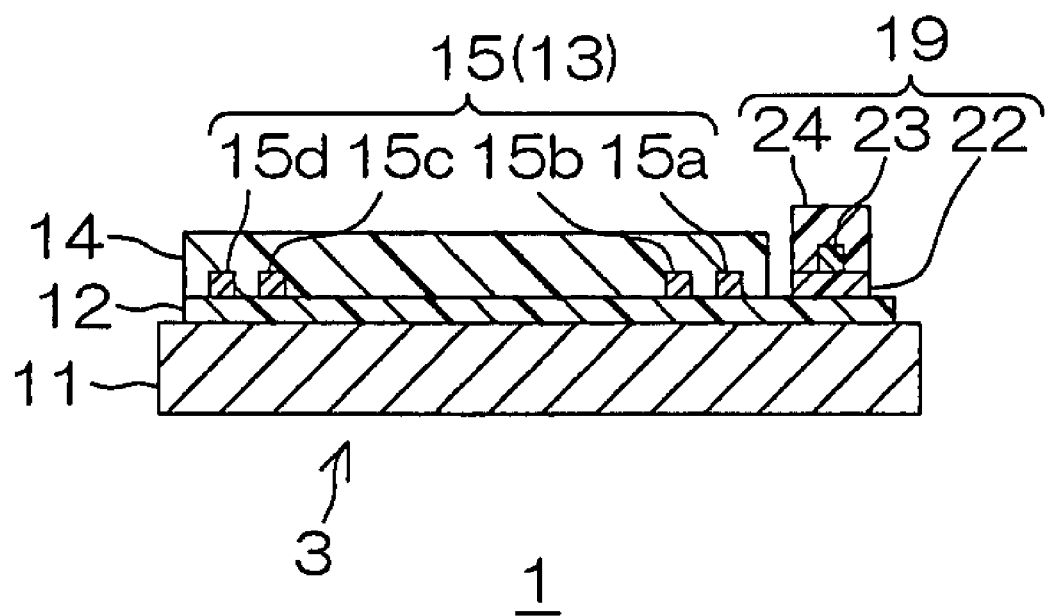
FIG. 3 is a sectional view of a wire portion of the suspension board with circuit shown in FIG. 1 taken along a widthwise direction, illustrating an embodiment in which the optical waveguide is provided on the insulating base layer.

FIG. 1 is a plan view illustrating a suspension board with circuit of an embodiment according to the present invention, FIG. 2 is a sectional view of the suspension board with circuit shown in FIG. 1 taken along an optical waveguide, and FIG. 3 is a sectional view of a wire portion of the suspension board with circuit shown in FIG. 1 taken along a direction perpendicular to the lengthwise direction (hereinafter referred to as the widthwise direction), illustrating an embodiment in which the optical waveguide is provided on an insulating base layer. An insulating base layer 12 and an insulating cover layer 14 are omitted in FIGS. 1 and 2.

In FIG. 1, the suspension board with circuit 1 includes a metal supporting board 11 mounted on a hard disk drive. A conductive pattern 13 for connecting a magnetic head 28 (cf. FIG. 5) and an external circuit board (e.g., a read/write board, etc.) is integrally formed on the metal supporting board 11. The metal supporting board 11 supports the magnetic head 28 mounted thereon, while holding a minute gap between the magnetic head and a hard disk 26 (cf FIG. 5) against an airflow caused when the magnetic head and the hard disk 26 travel relatively to each other.

The suspension board with circuit 1 is formed in the shape of a flat band extending in the lengthwise direction, integrally including a wire portion 3 arranged on one side in the lengthwise direction (hereinafter referred to as the rear side), and a gimbal portion 4 arranged on the other side in the lengthwise direction (hereinafter referred to as the tip side) of the wire portion 3.

The wire portion 3 is formed in a generally rectangular shape in plane view extending in the lengthwise direction.

The gimbal portion 4 is continuously formed from the tip of the wire portion 3, while having a generally rectangular shape in plane view expanding toward both widthwise outer sides of the wire portion 3. The gimbal portion 4 is also formed with a slit portion 5 having a generally U-shape opening toward the tip side in plane view. Further, the gimbal portion 4 integrally includes a tongue portion 6 sandwiched by the slit portion 5 in the widthwise direction, and an outrigger portion 8 arranged on both the widthwise outer sides of the slit portion 5 and on the tip side of the tongue portion 6.

The tongue portion 6 is formed in a generally rectangular shape in plane view, and includes a mounting portion 9 and a terminal forming portion 10.

The mounting portion 9 is a region for mounting a head slider 27, arranged on the rear side of the tongue portion 6, and formed in a generally rectangular shape in plane view.

The terminal forming portion 10 is a region in which a magnetic-head-side connecting terminal portion 17 described later is formed, and is arranged on the tip side of the mount portion 9. Further, the terminal forming portion 10 has an opening 7 having a generally rectangular shape in plane view.

The opening 7 has a generally rectangular shape in plane view penetrating the metal supporting board 11 in the thickness direction, and is formed in the vicinity of the mounting portion 9 at the widthwise center of the terminal forming portion 10.

The conductive pattern 13 includes an external connecting terminal portion 16, a magnetic-head-side connecting terminal portion 17, and a signal wire 15 for connecting the external connecting terminal portion 16 and the magnetic-head-side connecting terminal portion 17, which are formed integrally and continuously.

A plurality (four pieces) of the signal wires 15 are provided along the lengthwise direction of the suspension board with circuit 1, each signal wire 15 is arranged in parallel at spaced intervals to each other in the widthwise direction.

The plurality of signal wires 15 are formed with a first wire 15a, a second wire 15b, a third wire 15c, and a fourth wire 15d. These first wire 15a, the second wire 15b, the third wire 15c, and the fourth wire 15d are sequentially arranged from one side in the widthwise direction toward the other side in the widthwise direction.

More specifically, the first wire 15a, the second wire 15b, the third wire 15c, and the fourth wire 15d are formed so as to extend in parallel to each other in the wire portion 3. In the gimbal portion 4, the first wire 15a and the second wire, 15b are arranged along the outrigger portion 8 on one side in the widthwise direction, while the third wire 15c and the fourth wire, 15d are arranged along the outrigger portion 8 on the other side in the widthwise direction. The first wire 15a, the second wire 15b, the third wire 15c, and the fourth wire 15d are arranged to reach the tip side of the outrigger portion 8, then extending inward in the widthwise direction, yet turning back toward the rear side, and finally to reach the tip portion of the magnetic-head-side connecting terminal portion 17.

The first wire 15a and the second wire, 15b are arranged so as to make a detour around a light emitting device 20 described later toward the widthwise inner side in the wire portion 3.

A plurality (four pieces) of the external connecting terminal portions 16 are provided in the rear end portion of the wire portion 3, and arranged to be each connected with the rear end portion of each of the wires 15. Further, the external connecting terminal portions 16 are arranged at spaced intervals to each other in the widthwise direction. In the external connecting terminal portions 16, a first external connecting terminal portion 16a, a second external connecting terminal portion 16b, a third external connecting terminal portion 16c, and a fourth external connecting terminal portion 16d are sequentially arranged from one side in the widthwise direction toward the other side in the widthwise direction, corresponding to the first wire 15a, the second wire 15b, the third wire 15c, and the fourth wire 15d, which are connected to each of the external connecting terminal portions 16.

The magnetic-head-side connecting terminal portion 17 is arranged in the gimbal portion 4, and more specifically, arranged in the rear end portion of the terminal forming portion 10 in the tongue portion 6. A plurality (four pieces) of the magnetic-head-side connecting terminal portions 17 are provided with each connected with the tip portion of each of the signal wires 15.

More specifically, the magnetic-head-side connecting terminal portions 17 are arranged along the rear end edge (tip edge of the mount portion 9) of the terminal forming portion 10 at spaced intervals to each other in the widthwise direction. In the magnetic-head-side connecting terminal portions 17, a first magnetic-head-side connecting terminal portion 17a, a second magnetic-head-side connecting terminal portion 17b, a third magnetic-head-side connecting terminal portion 17c, and a fourth magnetic-head-side connecting terminal portion 17d are sequentially arranged from one side in the widthwise direction toward the other side in the widthwise direction, corresponding to the first wire 15a, the second wire 15b, the third wire 15c, and the fourth wire 15d, which are connected to each of the magnetic-head-side connecting terminal portions 17.

A terminal portion, which is not shown, of the magnetic head 28 is connected to the magnetic-head-side connecting terminal portions 17.

As shown in FIG. 3, the suspension board with circuit 1 includes the metal supporting board 11, the insulating base layer 12 formed on the metal supporting board 11, the conductive pattern 13 formed on the insulating base layer 12, and the insulating cover layer 14 formed on the insulating base layer 12 so as to cover the conductive pattern 13.

As shown in FIGS. 1 and 3, the metal supporting board 11 is formed corresponding to the outer shape of the suspension board with circuit 1.

The insulating base layer 12 is formed so as to expose the peripheral end edge of the metal supporting board 11 and so as to correspond to a position where the conductive pattern 13 and an optical waveguide 19 (described later) in the wire portion 3 and the gimbal portion 4 are formed. More specifically, the insulating base layer 12 is formed in the shape of a flat band slightly shorter in both the lengthwise and the widthwise directions than the metal supporting board 11.

The conductive pattern 13 is arranged over the wire portion 3 and the gimbal portion 4, and is formed as a wired circuit pattern including the external connecting terminal portion 16 and the magnetic-head-side connecting terminal portion 17, and the signal wire 15, which are formed integrally and continuously.

The insulating cover layer 14 is arranged over the wire portion 3 and the gimbal portion 4, corresponding to a position where the signal wire 15 is formed. The insulating cover layer 14 is formed so as to expose the external connecting terminal portion 16 and the magnetic-head-side connecting terminal portion 17, and to cover the signal wire 15. Further, the insulating cover layer 14 is arranged on the insulating base layer 12 so as to reserve a region for forming the optical waveguide 19 described later.

The suspension board with circuit 1 includes an optical assist portion 18 used for the optical assist system as shown in FIG. 1.

The optical assist portion 18 includes an optical waveguide 19 and a light emitting device 20.

The optical waveguide 19 is arranged over the wire portion 3 and the gimbal portion 4 along a direction in which the conductive pattern 13 extends.

More specifically, the optical waveguide 19 is arranged on one side in the widthwise direction of the wire portion 3, that is, spaced apart from the first wire 15a on the widthwise outermost side, and provided to extend in parallel to the first wire 15a. Further, the optical waveguide 19 is arranged on one side in the widthwise direction and the tip side of the outrigger portion 8, and in the terminal forming portion 10 at a spaced interval to the first wire 15 on the side opposite the second wire 15b, and is provided to extend in parallel to the first wire 15a. Specifically, the optical waveguide 19 is arranged to extend in parallel to the first wire 15a, then turn back toward the rear side in the outrigger portion 8 on the tip side, thereafter, extend along the widthwise center of the gimbal portion 4, and finally to reach the opening 7.

The optical waveguide 19 is optically connected to the light emitting device 20. More specifically, the optical waveguide 19 is formed with its rear end connected to the light emitting device 20 and its tip facing the opening 7.

The light emitting device 20 is a light source for allowing light to enter the optical waveguide 19, and for example, converts electric energy into light energy to emit high-energy light. The light emitting device 20 is arranged on the rear end side of the metal supporting board 11, and more specifically, arranged on the rear end side of the wire portion 3 at a spaced interval to the external connecting terminal portion 16 on the tip side thereof, and spaced apart from the signal wire 15 (first wire 15a) on one side in the widthwise direction. The light emitting device 20 is formed on the insulating base layer 12.

A supply wire 30 for supplying electric energy to the light emitting device 20 is connected to the light emitting device 20, and a supply terminal portion 31 to be connected to a terminal portion, which is not shown, of the external circuit board 2 is connected to the supply wire 30. The supply wire 30 extends along the signal wire 15 (first wire 15a) on the rear end side of the light emitting device 20, and the supply terminal portion 31 is arranged at a spaced interval to the external connecting terminal portion 16 (first external connecting terminal portion 16a) on one side in the widthwise direction. The supply wire 30 is covered with the insulating cover layer 14, and the supply terminal portion 31 is exposed from the insulating cover layer 14.

In the optical assist portion 18, the electric energy supplied through the supply terminal portion 31 and the supply wire 30 from the external circuit board 2 is converted into light energy in the light emitting device 20, and the resulting light is emitted to the optical waveguide 19. The light thus emitted passes the optical waveguide 19 and is reflected on the end face 21 described below, and the reflected light is applied to the hard disk 26.

Figure 5:
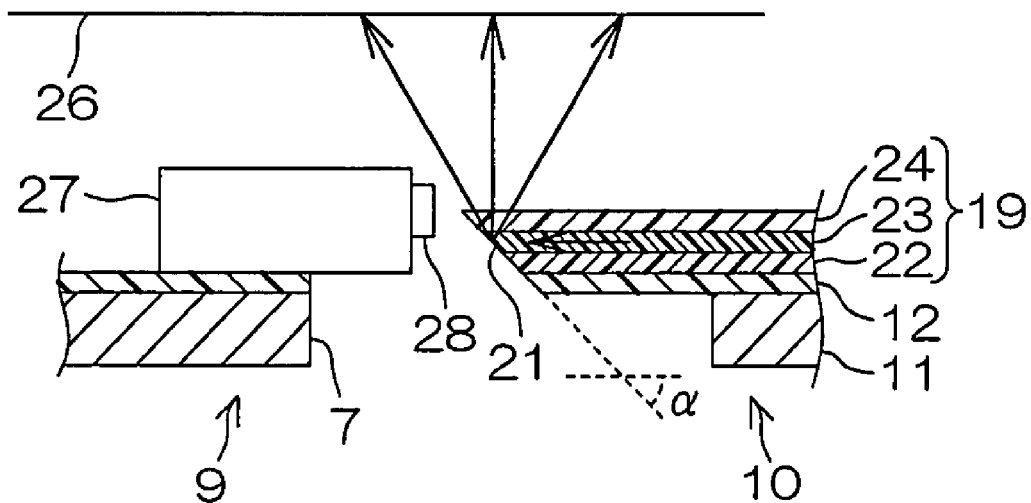
FIG. 5 is an explanatory view of a state in which a hard disk drive mounting a head slider, a magnetic head, and the suspension board with circuit shown in FIG. 1 thereon adopts an optical assist system to record information on a hard disk.

As shown in FIG. 5, the optical waveguide 19 is formed so that the end face 21 of the tip portion thereof intersects the lengthwise direction of the optical waveguide 19 at a given angle (tilt angle) $\alpha$, for example. This forms the optical waveguide 19 so that the end face 21 thereof is a mirror surface having a tilt angle $\alpha$. The light entered the optical waveguide 19 has its optical path deflected by the end face 21 at a given angle, and the light thus deflected is applied toward a desired position while being scattered. Such tilt angle a is not particularly limited, and is in the range of, for example, 35 to 55°, or preferably 40 to 50°, or more specifically 45°.

As shown in FIG. 3, in the suspension board with circuit 1, the optical waveguide 19 is provided on the insulating base layer 12.

Such optical waveguide 19 includes an under clad layer 22, a core layer 23 formed on the under clad layer 22, and an over clad layer 24 formed on the under clad layer 22 so as to cover the core layer 23.

Even the optical waveguide 19 facing a tip-side half of the opening 7 is formed on the insulating base layer 12. That is, the insulating base layer 12 faces the opening 7 corresponding to the optical waveguide 19 so as be in generally the same position in plane view as the optical waveguide 19.

The over clad layer 24 is formed so that both widthwise outer end edges thereof are in the same positions in plane view as those of the under clad layer 22.

Figure 4:
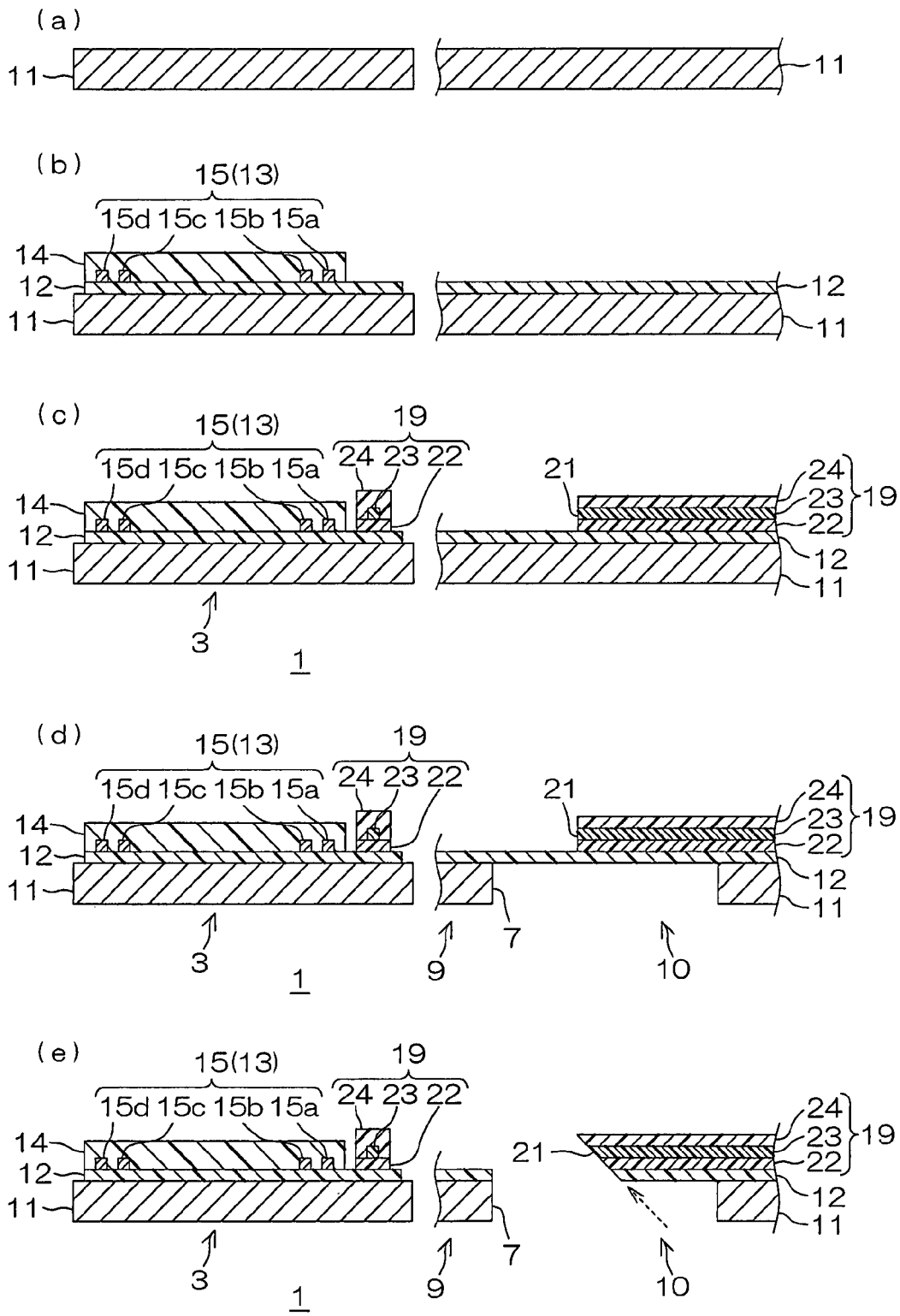
FIG. 4 is a sectional view illustrating the steps of producing a suspension board with circuit shown in FIG. 3, in which the left-side figure is a sectional view of the wire portion corresponding to FIG. 3 taken along the widthwise direction, and the right-side figure is an enlarged sectional view of a terminal forming portion taken along the lengthwise direction, (a) showing the step of preparing a metal supporting board, (b) showing the step of sequentially laminating an insulating base layer, a conductive pattern, and an insulating cover layer on the metal supporting board, (c) showing the step of forming an optical waveguide on the insulating base layer, (d) showing the step of forming an opening in the metal supporting board of the terminal forming portion, and (e) showing the step of cutting the insulating base layer and the optical waveguide by laser machining so that the end face of the tip portion of the optical waveguide intersects the lengthwise direction.

FIG. 4 is a sectional view illustrating the steps of producing a suspension board with circuit shown in FIG. 3, in which the left-side figure is a sectional view of the wire portion corresponding to FIG. 3 taken along the widthwise direction, and the right-side figure is an enlarged sectional view of a terminal forming portion taken along the lengthwise direction.

Next, a method for producing the suspension board with circuit 1 is described with reference to FIG. 4.

In this method, the metal supporting board 11 is first prepared, as shown in FIG. 4(a).

The metal supporting board 11 is formed of a metal material, such as stainless steel, 42-alloy, aluminum, copper-beryllium, or phosphor bronze. The metal supporting board 11 has a thickness in the range of, for example, 15 to 30 µm, or preferably 20 to 25 µm.

Subsequently, in this method, as shown in FIG. 4(b), the insulating base layer 12, the conductive pattern 13, and the insulating cover layer 14 are sequentially laminated on the metal supporting board 11.

To sequentially laminate these layers, the insulating base layer 12 is first formed on the metal supporting board 11.

The insulating base layer 12 is formed of an insulating material such as synthetic resin, for example, polyimide resin, polyamide imide resin, acrylic resin, polyether nitrile resin, polyether sulfone resin, polyethylene terephthalate resin, polyethylene naphthalate resin, polyvinyl chloride resin, or the like. The insulating base layer 12 is preferably formed of polyimide resin.

To form the insulating base layer 12, for example, a varnish of the insulating material described above having photosensitivity is applied to the upper surface of the metal supporting board 11 and is then dried. Thereafter, the dried varnish is exposed to light via a photomask, and is then developed to be cured as required.

The insulating base layer 12 thus formed has a thickness in the range of, for example, 1 to 35 µm, or preferably 8 to 15 µm.

Subsequently, the conductive pattern 13 is formed in the above-mentioned pattern.

As a conductive material for forming the conductive pattern 13, for example, copper, nickel, gold, solder, or alloys thereof is used.

To form the conductive pattern 13, a known patterning method, such as an additive method or a subtractive method, or preferably the additive method is used.

The conductive pattern 13 thus formed has a thickness in the range of, for example, 3 to 50 µm, or preferably 5 to 20 µm. Each of the signal wires 15 has a width in the range of, for example, 10 to 200 µm, or preferably 20 to 100 µm, and a spacing between each of the signal wires 15 is in the range of, for example, 10 to 1000 µm, or preferably 20 to 100 µm. Each of the external connecting terminal portions 16 and each of the magnetic-head-side connecting terminal portions 17 have a width in the range of, for example, 20 to 1000 µm, or preferably 30 to 800 µm, and a spacing between each of the external connecting terminal portions 16 and between each of the magnetic-head-side connecting terminal portions 17 are in the range of, for example, 20 to 1000 µm, or preferably 30 to 800 µm.

To form the insulating cover layer 14 in the above-mentioned pattern, for example, a varnish of the insulating material described above having photosensitivity is applied to the surface of the metal supporting board 11 including the conductive pattern 13 and the insulating base layer 12, and is then dried. Thereafter, the dried varnish is exposed to light via a photomask, and is then developed to be cured as required.

The insulating cover layer 14 thus formed has a thickness in the range of, for example, 1 to 40 μm, or preferably 1 to 7 μm.

Therefore, the insulating base layer 12, the conductive pattern 13, and the insulating cover layer 14 can be sequentially laminated on the metal supporting board 11.

The supply wiring 30 and the supply terminal portion 31 are simultaneously formed in the same manner as above along with the formation of the above-mentioned conductive pattern 13.

Subsequently, in this method, as shown in FIG. 4(c), the optical waveguide 19 is formed on the insulating base layer 12.

To form the optical waveguide 19, the under clad layer 22, the core layer 23, and the over clad layer 24 are sequentially laminated on the insulating base layer 12.

To sequentially laminate the under clad layer 22, the core layer 23, and the over clad layer 24, the under clad layer 22 is first formed on the insulating base layer 12.

As a material for forming the under clad layer 22, for example, polyimide resin, polyamide resin, silicone resin, epoxy resin (alicyclic epoxy resin, etc.), acrylic resin, or fluorene derivative resin, a mixed resin of fluorene derivative resin and alicyclic epoxy resin, and a mixed resin of any of these resins and an alicyclic ether compound (for example, an oxetane compound, etc.) is used. These resins are preferably used in the form of photosensitive resins containing a photosensitizer. Preferably, a mixed resin of a photosensitive fluorene derivative resin (a photosensitive fluorene epoxy resin as raw material) and an alicyclic epoxy resin is used. The photosensitizer that may be used includes, for example, a known onium salt, and more specifically, 4,4-bis[di(β-hydroxyethoxy)phenylsulfinio] phenylsulfid-bis-hexafluoroantimonate, or the like.

To form the under clad layer 22 in the above-mentioned pattern, for example, a varnish (resin solution) of any of the above-mentioned resins is prepared using a known diluent, the varnish thus prepared is applied to the surface of the insulating base layer 12. Thereafter, the applied varnish is dried, and is then cured as required. In the case of using a varnish of a photosensitive resin, after the application and the drying of the varnish, the dried varnish is exposed to light via a photomask, and is then developed by dissolving an unexposed portion with a known organic solvent or the like. Thereafter, the developed varnish is cured as required.

The under clad layer 22 thus formed has a refractive index in the range of, for example, 1.45 to 1.55. Further, the under clad layer 22 has a thickness in the range of, for example, 1 to 50 μm, or preferably 5 to 20 μm, and has a width in the range of, for example, 20 to 200 μm, or preferably 30 to 100 μm.

Subsequently, the core layer 23 is formed on the under clad layer 22.

As a material for forming the core layer 23, a resin material having a higher refractive index than that for the under clad layer 22 is used. The resin material that may be used includes, for example, the same resin as those mentioned above. Preferably, a mixed resin of a photosensitive fluorene derivative resin (a photosensitive fluorene epoxy resin as raw material) and an oxetane compound is used.

To form the core layer 23 in the above-mentioned pattern, for example, a varnish (resin solution) of any of the above-mentioned resins is prepared using a known diluent, the varnish thus prepared is applied to the surface of the insulating base layer 12 including the under clad layer 22. Thereafter, the applied varnish is dried, and is then cured as required. In the case of using a varnish of a photosensitive resin, after the application and the drying of the varnish, the dried varnish is exposed to light via a photomask, and is then developed by dissolving an unexposed portion with a known organic solvent or the like. Thereafter, the developed varnish is cured as required.

The refractive index of the core layer 23 thus formed is set higher than that of the under clad layer 22, and is in the range of, for example, 1.55 to 1.65. Further, the core layer 23 has a thickness in the range of, for example, 1 to 30 μm, or preferably 2 to 20 μm, and has a width in the range of, for example, 1 to 30 μm, or preferably 2 to 20 μm.

Subsequently, the over clad layer 24 is formed on the under clad layer 22 so as to cover the core layer 23.

As a material for forming the over clad layer 24, the same resin material as that for the under clad layer 22 described above is used.

To form the over clad layer 24 in the above-mentioned pattern, for example, a varnish (resin solution) of any of the above-mentioned resins is prepared using a known diluent, the varnish thus prepared is applied to the surface of the insulating base layer 12 including the core layer 23 and the under clad layer 22. Thereafter, the applied varnish is dried, and is then cured as required. In the case of using a varnish of a photosensitive resin, after the application and the drying of the varnish, the dried varnish is exposed to light via a photomask, and is then developed by dissolving an unexposed portion with a known organic solvent or the like. Thereafter, the developed varnish is cured as required.

The refractive index of the over clad layer 24 thus formed is set lower than that of the core layer 23, and is set to, for example, the same refractive index as that of the under clad layer 22. Further, the over clad layer 24 has a thickness from the surface of the core layer 23 in the range of, for example, 1 to 50 μm, or preferably 5 to 20 μm, and has a width in the range of, for example, 20 to 200 μm, or preferably 30 to 100 μm.

Thus, the under clad layer 22, the core layer 23, and the over clad layer 24 are sequentially laminated on the insulating base layer 12, whereby the optical waveguide 19 including these layers can be formed.

Subsequently, in this method, as shown in FIG. 4(d), the opening 7 is formed in the metal supporting board 11 in the terminal forming portion 10.

The opening 7 is formed by, for example, boring such as drilling, or for example, etching such as dry etching and wet etching, or preferably by etching.

The opening 7 is formed so as to be overlapped with the tip portion of the optical waveguide 19 in the thickness direction, more specifically, so that the tip portion of the optical waveguide 19 is arranged in the center of the opening 7 in the widthwise direction and in a tip-side half of the opening 7 in the lengthwise direction.

The opening 7 thus formed has a width in the range of, for example, 50 to 500 μm, or preferably 100 to 200 μm, and a length (length in lengthwise direction) in the range of, for example, 50 to 500 μm, or preferably 100 to 200 μm.

Subsequently, in this method, as shown in FIG. 4(e), the tip portions of the insulating base layer 12 and the optical waveguide 19 are cut from the opening 7 side by laser machining so that the end face 21 of the tip portion of the optical waveguide 19 intersects the lengthwise direction.

In the laser machining, as indicated by dashed lines in FIG. 4(e), a laser light which passes through the opening 7 is applied from the opening 7 side (the under side in thickness direction) to the insulating base layer 12 and the optical waveguide 19 so as to intersect with the lengthwise direction at a given angle, thereby cutting the insulating base layer 12 and the optical waveguide 19 at a time.

This allows to cut the insulating base layer 12 and the optical waveguide 19 from the opening 7 side by laser machining while the end face 21 of the tip portion of the optical waveguide 19 intersects the lengthwise direction.

Thereafter, on the rear end side of the wire portion 3, the light emitting device 20 is disposed on the insulating base layer 12 so as to be optically connected with the rear end of the optical waveguide 19 and be electrically connected with the tip of the supply wire 30. Thus, the suspension board with circuit 1 is obtained.

In the suspension board with circuit 1 thus obtained, as indicated by dashed lines in FIGS. 1 and 2, the external connecting terminal portion 16 and the supply terminal portion 31 are connected in the wire portion 3 with a terminal portion, which is not shown, of the external circuit board 2. On the external circuit board 2, the magnetic head 28 (cf. FIG. 5) and an IC 32 for controlling the light emitting device 20 are mounted, and the IC 32 is electrically connected via an IC wire 33 with the terminal portion to be connected with the external connecting terminal portion 16 and the supply terminal portion 31.

In the suspension board with circuit 1, as shown in FIGS. 1 and 5, the head slider 27 mounts mounted on the mount portion 9 of the gimbal portion 4. The head slider 27 has the magnetic head 28 mounted thereon, and the mounting of the above-mentioned head slider 27 allows a terminal portion, which is not shown, of the magnetic head 28 to be electrically connected with the magnetic-head-side connecting terminal portion 17. Further, such mounting allows the magnetic head 28 to be opposed in the vicinity of the end face 21 of the tip portion of the optical waveguide 19 while facing the opening 7.

The hard disk drive mounted with the magnetic head 28, the head slider 27, the suspension board with circuit 1, and the external circuit board 2 can adopt the optical assist system.

In the hard disk drive, for example, the hard disk 26 travels relatively to the end face 21 of the tip portion of the optical waveguide 19 and to the magnetic head 28. A light emitted from the light emitting device 20 passes the optical waveguide 19, an optical path of the light is deflected or scattered upward on the end face 21, and the resulting light is then applied to the surface of the hard disk 26 opposed to the upper side of the end face 21. The application of the light from the end face 21 of the optical waveguide 19 causes to heat the surface of the hard disk 26. In such state, a magnetic field is applied from the magnetic head 28, whereby information is recorded on the hard disk 26. At the time, the coercive force of the hard disk 26 is reduced, so that the information can be recorded on the hard disk 26 at high density by applying a small magnetic field.

In the suspension board with circuit 1, the optical waveguide 19 used in the optical assist system can be formed with more sufficient space than the head slider 27 that is formed smaller than the suspension board with circuit 1.

Especially, the optical waveguide 19 is provided on the insulating base layer 12 having more sufficient space than the head slider 27, so that freedom flexibility can be ensured, production efficiency can be improved and reduction of production cost can also be achieved.

Since the suspension board with circuit 1 includes the light emitting device 20, and the light emitting device 20 is optically connected with the optical waveguide 19, the light emitting device 20 and the optical waveguide 19 can be provided together on the insulating base layer 12. This can improve reliability of optical connection, thereby allowing to reliably perform the optical assist system.

Since the suspension board with circuit 1 includes the mount portion 9, the head slider 27 can be securely mounted. Further, in the suspension board with circuit 1, since the opening 7 is formed in the vicinity of the mounting portion 9 and the tip portion of the optical waveguide 19 is facing the opening 7, the end face 21 of the tip portion of the optical waveguide 19 can be reliably cut by laser machining.

That is, in the method for producing the suspension board with circuit 1, the insulating base layer 12 and the optical waveguide 19 are cut from the opening 7 side by laser machining so that the end face 21 of the tip portion of the optical waveguide 19 intersects the lengthwise direction. This allows to cut the insulating base layer 12 and the optical waveguide 19 to be at a time in the opening 7, so that the end face 21 can be reliably formed with a smooth mirror surface. Therefore, in the suspension board with circuit 1, the light emitted from the optical waveguide 19 can be reliably applied to a desired position, that is, the surface of the hard disk 26, and at the same time, the suspension board with circuit 1 can be simply and quickly produced. Thus, production efficiency can be improved and reduction of production cost can also be achieved.

In the suspension board with circuit 1, the light emitting device 20 is arranged on the rear end side thereof, that is, on the rear end side of the wire portion 3, while the mounting portion 9 is arranged on the tip side thereof, that is, in the tongue portion 6 of the gimbal portion 4. Thus, the freedom of designing the layout of the light emitting device 20 and the head slider 27 can be reliably ensured.

Figure 6:
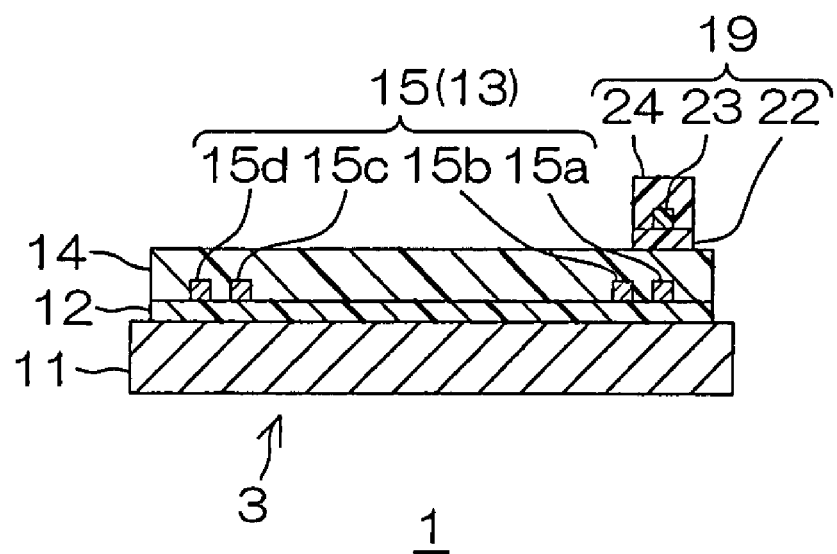
FIG. 6 is a sectional view of the wire section of the suspension board with circuit shown in FIG. 1 taken along the widthwise direction, illustrating an embodiment in which the optical waveguide is provided on the insulating cover layer.
Figure 7:
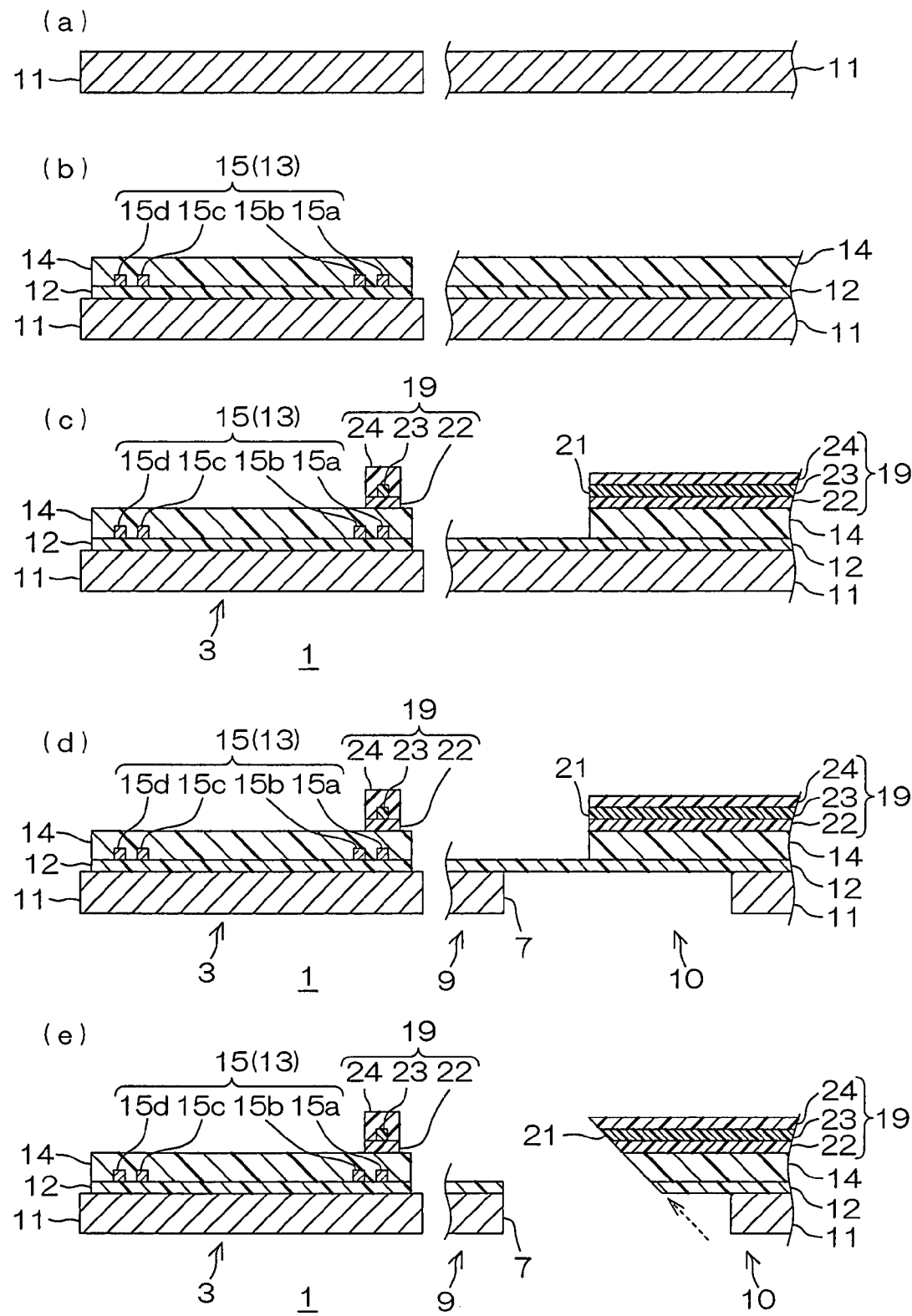
FIG. 7 is a sectional view illustrating the steps of producing a suspension board with circuit shown in FIG. 6, in which the left-side figure is a sectional view of the wire portion corresponding to FIG. 6 taken along the widthwise direction, and the right-side figure is an enlarged sectional view of the terminal forming portion taken along the lengthwise direction, (a) showing the step of preparing a metal supporting board, (b) showing the step of sequentially laminating an insulating base layer, a conductive pattern, and an insulating cover layer on the metal supporting board, (c) showing the step of forming an optical waveguide on the insulating cover layer, (d) showing the step of forming an opening in the metal supporting board of the terminal forming portion, and (e) showing the step of cutting the insulating base layer, the insulating cover layer, and the optical waveguide by laser machining so that the end face of the tip portion of the optical waveguide intersects the lengthwise direction.

FIG. 6 is a sectional view of the wiring section of the suspension board with circuit shown in FIG. 1 taken along the widthwise direction, illustrating an embodiment in which the optical waveguide is provided on the insulating cover layer, and FIG. 7 is a sectional view illustrating the steps of producing a suspension board with circuit shown in FIG. 6, in which the left-side figure is a sectional view of the wire portion corresponding to FIG. 6 taken along the widthwise direction, and the right-side figure is an enlarged sectional view of the terminal forming portion taken along the lengthwise direction. The same reference numerals in FIGS. 6 and 7 are provided for members corresponding to each described above and their description is omitted.

In the above description, the optical waveguide 19 is provided on the insulating base layer 12. However, the optical waveguide 19 may be provided, for example, on the insulating cover layer 14.

In FIG. 6, in the suspension board with circuit 1, the insulating cover layer 14 is formed so that its peripheral end edge is in generally the same position in plane view as the peripheral end edge of the insulating base layer 12.

The optical waveguide 19 is formed over the signal wire 15 (more specifically, first wire 15a) in the wire portion 3 and in the outrigger portion 8 of the gimbal portion 4. The core layer 23 of the optical waveguide 19 is formed in the wire portion 3 and in the outrigger portion 8 of the gimbal portion 4 so as to be overlapped with the first wire 15a in plane view.

The optical waveguide 19 is also formed on the insulating cover layer 14 in the terminal forming portion 10 of the gimbal portion 4, and is arranged so as to be offset to the other side in the widthwise direction from the first wire 15a in the terminal forming portion 10. More specifically, the optical waveguide 19 is spaced away from the first wire 15a while extending in parallel to the first wire 15a. That is, in the terminal forming portion 10, the optical waveguide 19 is arranged so as to extend along the center of the terminal forming portion 10 and then reach the opening 7.

The light emitting device 20 is formed on the insulating cover layer 14.

To produce the suspension board with circuit 1, the metal supporting board 11 is first prepared as shown in FIG. 7(a), and then, the insulating base layer 12, the conductive pattern 13, and the insulating cover layer 14 are then sequentially laminated on the metal supporting board 11 as shown in FIG. 7(b). Subsequently, as shown in FIG. 7(c), the optical waveguide 19 is formed on the insulating cover layer 14. Then, as shown in FIG. 7(d), the opening 7 is formed in the metal supporting board 11 in the terminal forming portion 10, and as shown in FIG. 7(e), the insulating base layer 12, the insulating cover layer 14, and the optical waveguide 19 are cut from the opening 7 side by laser machining so that the end face 21 of the tip portion of the optical waveguide 19 intersects the lengthwise direction. Thus, the suspension board with circuit 1 can be produced.

Accordingly, since the optical waveguide 19 is formed on the insulating cover layer 14, even though the insulating base layer 12 does not have sufficient space, freedom of designing the optical waveguide 19 can be ensured, production efficiency can be improved, and reduction of production cost can also be achieved.

In the above description, the optical waveguide 19 is provided on one side in the widthwise direction of the first wire 15a. However, such arrangement is not limited thereto and, for example, the optical waveguide 19 can be provided on the other side in the widthwise direction of the fourth wire 15d, which is not shown. Further, the optical waveguide 19 may be formed on the opposite side of the first wire 15a with respect to the second wire 15b (i.e., on the opposite side of the fourth wire 15d with respect to the third wire 15c), between the first wire 15a and the second wire 15b, or between the third wire 15c and the fourth wire 15d. Preferably, from the viewpoint of spacing, and the viewpoint of arranging the tip portion of the optical waveguide 19 in the widthwise center of the gimbal portion 4, the optical waveguide 19 is provided on one side in the widthwise direction of the first wire 15a, or the other side in the widthwise direction of the fourth wire 15d.

In the above description, one optical waveguide 19 is provided in the suspension board with circuit 1. However, the number is not particularly limited thereto and, for example, a plurality of optical waveguides 19 may be provided depending on the application and purpose of the suspension board with circuit 1.

In the above description, the under clad layer 22 and the over clad layer 24 are provided in the optical waveguide 19. However, the optical waveguide 19 may be formed, for example, without providing the under clad layer 22 and/or the over clad layer 24.

More specifically, when the refractive index of the insulating cover layer 14 is lower than that of the core layer 23, the insulating cover layer 14 can also serve as the under clad layer 22 without providing the under clad layer 22.

Further, when the refractive index of the insulating base layer 12 is lower than that of the core layer 23, the insulating base layer 12 can also serve as the under clad layer 22 without providing the under clad layer 22. In such case, when the refractive index of the insulating cover layer 14 is lower than that of the core layer 23, the insulating cover layer 14 and the over clad layer 24 can be further integrally formed as one layer. That is, neither of the over clad layer 24 nor the under clad layer 22 is provided, and the insulating cover layer 14 can save as the over clad layer 24 and the insulating base layer 12 can also serve as the over clad layer 24 and the under clad layer 22, respectively.

Figure 8:
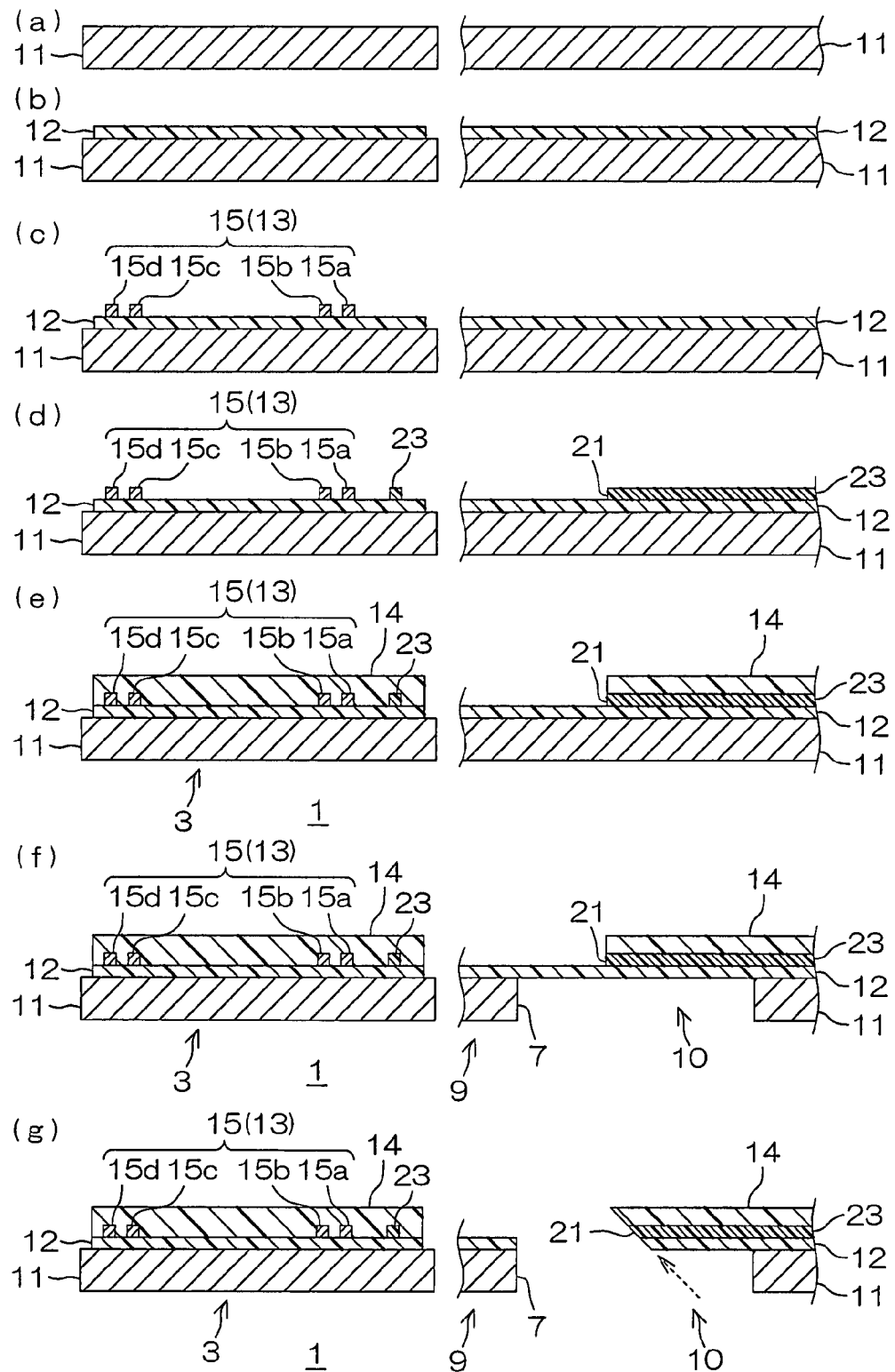
FIG. 8 is a sectional view illustrating the steps of producing a suspension board with circuit shown, in which the left-side figure is a sectional view of the wire portion taken along the widthwise direction, and the right-side figure is an enlarged sectional view of the terminal forming portion taken along the lengthwise direction, (a) showing the step of preparing a metal supporting board, (b) showing the step of forming an insulating base layer also serving as an under clad layer on a metal supporting board, (c) showing the step of forming a conductive pattern on the insulating base layer, (d) showing the step of forming a core layer on the insulating base layer, (e) showing the step of forming an insulating cover layer also serving as an over clad layer on the insulating base layer so as to cover the conductive pattern and the core layer, (f) showing the step of forming an opening in the metal supporting board of the terminal forming portion, and (g) showing the step of cutting the tip portions of the insulating base layer, the core layer, and the insulating cover layer from the opening side by laser machining so that the end face of those tip portions intersect the lengthwise direction.

To produce such suspension board with circuit 1, as shown in FIG. 8(a), the metal supporting board 11 is first prepared.

Then, as shown in FIG. 8(b), the insulating base layer 12 that also serves as the under clad layer 22 is formed on the metal supporting board 11. To form such insulating base layer 12, for example, a varnish (resin solution) of the same resin material as the resin material for forming the above-mentioned insulating base layer 12, or the resin material for forming the under clad layer 22 is prepared, the varnish thus prepared is applied to the upper surface of the metal supporting board 11, and is then dried. Thereafter, the dried varnish is exposed to light via a photomask and developed as required, and is then cured as required.

The insulating base layer 12 has a refractive index in the range of, for example, 1.45 to 1.70, and has a thickness in the range of, for example, 1 to 35 μm, or preferably 5 to 15 μm.

Thereafter, as shown in FIG. 8(c), the conductive pattern 13 is formed on the insulating base layer 12. To form the conductive pattern 13, for example, as described above, a known patterning method, such as an additive method or a subtractive method, or preferably the additive method is used. The conductive pattern 13 is formed of the same conductive material as described above in the same pattern as the conductive pattern 13 shown in FIG. 1.

Along with the formation of the conductive pattern 13, the supply wire 30 and the supply terminal portion 31 are simultaneously formed in the same manner as above.

Subsequently, as shown in FIG. 8(d), the core layer 23 is formed on the insulating base layer 12.

To form the core layer 23, a varnish (resin solution) of the resin material for forming the above-mentioned core layer 23 is prepared, the varnish thus prepared is applied on the upper surface of the insulating base layer 12, and is then dried. Thereafter, the dried varnish is exposed to light via a photomask and developed as required, and is then cured as required.

The refractive index of the core layer 23 is set higher than those of the insulating base layer 12 and the insulating cover layer 14, and is in the range of, for example, 1.55 to 1.65. Further, the core layer 23 has a thickness in the range of, for example, 1 to 30 μm, or preferably 2 to 20 μm, and has a width in the range of, for example, 1 to 30 μm, or preferably 2 to 20 μm. The core layer 23 is arranged in the same pattern as the core layer 23 shown in FIG. 1.

Next, as shown in FIG. 8(e), the insulating cover layer 14 that also serves as the over clad layer 24 is formed on the insulating base layer 12 so as to cover the conductive pattern 13 (including the supply wire 30) and the core layer 23. To form such insulating cover layer 14 that also serves as the one clad layer 24, for example, a varnish (resin solution) of the same resin material as the resin material for forming the above-mentioned insulating cover layer 14, or the resin material for forming the over clad layer 24 is prepared, the varnish thus prepared is applied to the upper surface of the insulating base layer 12 including the conductive pattern 13 and the core layer 23, and is then dried. Thereafter, the dried varnish is exposed to light via a photomask and developed as required, and is then cured as required. Thus, the insulating cover layer 14 is formed so as to expose the external connecting terminal portion 16, the magnetic-head-side connecting terminal portion 17, and the supply terminal portion 31 and to cover the signal wire 15, the core layer 23, and the supply terminal portion 31.

The insulating cover layer 14 has a refractive index in the range of, for example, 1.45 to 1.70, and has a thickness (thickness from the surface of the core layer) in the range of, for example, 1 to 40 μm, or preferably 1 to 12 μm.

Then, as shown in FIG. 8(f), the opening 7 is formed in the metal supporting board 11 in the terminal forming portion 10 in the same manner as above. Thereafter, as shown in FIG. 8(g), the tip portions of the insulating base layer 12, the core layer 23, and the insulating cover layer 14 are cut from the opening 7 side by laser machining so that the end face 21 of those tip portions intersects the lengthwise direction. Thus, the suspension board with circuit 1 can be produced.

In the suspension board with circuit 1 thus produced, the insulating base layer 12 also serves as the under clad layer 22, the insulating cover layer 14 also serves as the over clad layer 24, and the conductive pattern 13 and the core layer 23 are both covered with the insulating cover layer 14 on the upper surface of the insulating base layer 12.

Thus, the suspension board with circuit 1 can be made thinner, the construction thereof can be simplified, and the production man hour can be reduced, resulting in improvement of production efficiency and cost reduction.

In the above description, the over clad layer 24 or the insulating cover layer 14 is provided so as to cover the core layer 23. However, neither of the over clad layer 24 or the insulating cover layer 14 layers is provided, and the core layer 23 may be exposed, more specifically, the core layer 23 may be exposed to air to serve as a so-called air clad. Preferably, the over clad layer 24 or the insulating cover layer 14 is provided from the viewpoint of preventing the core layer 23 from damage of an external factor.

Further, instead of the under clad layer 22 or the over clad layer 24, a light reflection layer made of a metal thin layer may be provided.

In the above description, the opening 7 is formed in the widthwise center of the gimbal portion 4. However, the arrangement is not limited thereto and, for example, the opening 7 may be formed in one end portion in the widthwise direction or the other end portion in the widthwise direction. Preferably, the opening 7 is formed in the widthwise center of the gimbal portion 4 in order to arrange the widthwise center portion of the head slider 27 and the tip portion of the optical waveguide 19 in opposed relation to each other in the lengthwise direction.

EXAMPLE

While in the following, the present invention is described in further detail with reference to Examples, the present invention is not limited to any of them by no means.

Example 1

Embodiment in which Optical Waveguide is Provided on Insulating Base Layer

A metal supporting board made of a 20 μm thick stainless steel was prepared (cf. FIG. 4(a)).

Then, an insulating base layer of polyimide resin was formed on the metal supporting board in the above-mentioned pattern. The insulating base layer thus formed had a thickness of 10 μm.

Subsequently, a conductive pattern, and a supply wire and a supply terminal portion, all made of copper, were simultaneously formed by an additive method. These had a thickness of 10 μm.

Then, an insulating cover layer of polyimide resin was formed on the insulating base layer in the above-mentioned pattern. The insulating cover layer had a thickness of 5 μm. Thus, the insulating base layer, the conductive pattern, and the insulating cover layer were sequentially laminated on the metal supporting board (cf. FIG. 4(b)).

Next, an optical waveguide was formed on the insulating base layer. To form the optical waveguide, an under clad layer was first formed.

To form the under clad layer in the above-mentioned pattern, first, 35 parts by weight of bisphenoxyethanolfluorene diglycidyl ether (fluorene derivative, epoxy equivalent: 300 g/eq.), 25 parts by weight of alicyclic epoxy resin having a cyclohexene oxide structure (CELLOXIDE 2081, commercially available from DAICEL CHEMICAL INDUSTRIES, LTD.), 2 parts by weight of 50% propionic carbonate solution of 4,4-bis[di(β-hydroxyethoxy)phenylsulfinio] phenylsulfid-bis-hexafluoroantimonate (photosensitizer), and 40 parts by weight of 3,4-epoxycyclohexylmethyl-3',4'-epoxycyclohexenecarboxylate(diluent, alicyclic epoxy, CELLOXIDE 2021P, commercially available from DAICEL CHEMICAL INDUSTRIES, LTD.) were mixed to prepare a varnish. Subsequently, the varnish was applied to the surface of the insulating base layer, and was then dried by heating the applied varnish at 80° C. for 15 minutes. Thereafter, the varnish thus dried was exposed to light via a photomask, and was then developed by dissolving an unexposed portion of the varnish with a gamma-butyrolactone organic solvent. Then, the varnish thus developed was heated at 100° C. for 15 minutes to be cured, thereby forming an under clad layer on the insulating base layer.

The under clad layer (under clad layer after curing) had a refractive index of 1.540 at a wavelength of 830 nm. Further, the under clad layer had a thickness of 10 μm and a width of 30 μm.

Next, a core layer was formed on the under clad layer.

To form the core layer in the above-mentioned pattern, first, 70 parts by weight of bisphenoxyethanolfluorene diglycidyl ether (fluorene derivative, epoxy equivalent: 300 g/eq.), 30 parts by weight of 1,1,1-tris{4-[2-(3-oxetanyl)]butoxyphenyl}ethane (oxetane compound), 1 parts by weight of 50% propionic carbonate solution of 4,4-bis[di(β-hydroxyethoxy)phenylsulfinio] phenylsulfid-bis-hexafluoroantimonate (photosensitizer), and 30 parts by weight of ethyl lactate (diluent) were mixed to prepare a varnish. Subsequently, the varnish was applied to the surface of the insulating base layer including the under clad layer, and was then dried by heating the applied varnish at 80° C. for 15 minutes. Thereafter, the varnish thus heated was exposed to light via a photomask, and was then developed by dissolving an unexposed portion of the varnish with a gamma-butyrolactone organic solvent. Then, the varnish thus developed was heated at 100° C. for 15 minutes to be cured, thereby forming a core layer on the under clad layer.

The core layer (core layer after curing) had a refractive index of 1.594 at a wavelength of 830 nm. Further, the core layer had a thickness of 5 μm and a width of 5 μm.

Next, an over clad layer was formed on the under clad layer so as to cover the core layer.

To form the over clad layer in the above-mentioned pattern, first, the same varnish as that for forming the above-mentioned under clad layer was prepared. Subsequently, the varnish was applied to the surface of the insulating base layer including the core layer and the under clad layer, and was then dried by heating the applied varnish at 80° C. for 15 minutes. Thereafter, the varnish thus heated was exposed to light via a photomask, and was then developed by dissolving an unexposed portion of the varnish with a gamma-butyrolactone organic solvent. Then, the varnish thus developed was heated at 100° C. for 15 minutes to be cured, thereby forming an over clad layer on the under clad layer so as to cover the core layer.

The over clad layer (over clad layer after curing) had a refractive index of 1.540 at a wavelength of 830 nm. Further, the over clad layer had a thickness from the surface of the core layer of 10 μm and a width of 30 μm.

Thus, the optical waveguide was formed on the insulating base layer at a spaced interval to the first wire (cf. FIG. 4(c)).

Next, an opening having a rectangular shape in plane view was formed in the metal supporting board in a terminal forming portion by wet etching (cf. FIG. 4(d)). The opening had a width of 100 μm and a length of 100 μm.

Subsequently, the insulating base layer and the optical waveguide were cut at a time from the opening side by laser machining so that the end face of the tip portion of the optical waveguide intersected the lengthwise direction (cf. FIG. 4(e)). The end face thus formed by the cutting had a tilt angle of 45°.

Thereafter, on the rear end side of a wire portion on the suspension board with circuit, a light emitting device was disposed on the insulating base layer so as to be optically connected with the rear end of the optical waveguide and be electrically connected with the tip of the supply wire (cf. FIGS. 1 and 2).

Example 2

Embodiment in which Optical Waveguide is Provided on Insulating Cover Layer The suspension board with circuit was produced in the same method as in Example 1 except that the optical waveguide was provided on the insulating cover layer and the light emitting device was disposed on the insulating cover layer in Example 1 (cf FIGS. 1, 2, and 7).

That is, the insulating cover layer was formed so that the peripheral end edge thereof was in generally the same position in plane view as that of the insulating base layer (cf. FIG. 7(b)).

Further, the optical waveguide was formed on the insulating cover layer so as to be overlapped with the first wire in the wire portion and the outrigger portion of the gimbal portion, and be offset to the first wire portion and the other side in the widthwise direction in the terminal forming portion. Then, the light emitting device was disposed on the insulating cover layer.

Example 3

Embodiment in which Insulating Base Layer, and Insulating Cover Layer also Serve as Over Clad Layer A metal supporting board made of a 20 μm thick stainless steel was prepared (cf. FIG. 8(a)).

Then, an insulating base layer of polyimide resin was formed on the metal supporting board in the above-mentioned pattern. The insulating base layer had a refractive index of 1.541 at a wavelength of 830 nm, and had a thickness of 6 μm (cf. FIG. 8(b)).

Subsequently, a conductive pattern, and a supply wire and a supply terminal portion, all made of copper, are simultaneously formed on the insulating base layer by an additive method (cf. FIG. 8(c)). These had a thickness of 10 μm.

Then, a core layer was formed on the insulating base layer.

To form the core layer in the above-mentioned pattern, first, 70 parts by weight of bisphenoxyethanolfluorene diglycidyl ether (fluorene derivative, epoxy equivalent: 300 g/eq.), 30 parts by weight of 1,3,3-tris{4-[2-(3-oxetanyl)] butoxy phenyl} ethane (oxetane compound), 0.5 parts by weight of a 50% propionic carbonate solution of 4,4-bis[di(β-hydroxyethoxy)phenylsulfinio] phenylsulfid-bis-hexafluoroantimonate (photosensitizer), and 28 parts by weight of ethyl lactate (diluent) were mixed to prepare a varnish. Subsequently, the varnish was applied to the surface of the insulating base layer, and was then dried by heating the applied varnish at 80° C. for 15 minutes. Thereafter, the varnish thus heated was exposed to light via a photomask, and was then developed by dissolving an unexposed portion of the varnish with a gamma-butyrolactone organic solvent. Then, the varnish thus developed was heated at 100° C. for 15 minutes to be cured, thereby forming a core layer on the insulating base layer (cf. FIG. 8(d)).

The core layer (core layer after curing) had a refractive index of 1.588 at a wavelength of 830 nm. Further, the core layer had a thickness of 5 μm and a width of 5 μm.

Next, an insulating cover layer was formed on the insulating base layer in the above-mentioned pattern so as to cover the conductive pattern and the core layer.

To form the insulating cover layer in the above-mentioned pattern, first, 35 parts by weight of bisphenoxyethanolfluorene diglycidyl ether (fluorene derivative, epoxy equivalent: 300 g/eq.), 40 parts by weight of (3,4-epoxycyclohexane) methyl-3',4'-epoxycyclohexyl-carboxylate, 25 parts by weight of alicyclic epoxy resin having a cyclohexene oxide structure (CELLOXIDE 2081, commercially available from DAICEL CHEMICAL INDUSTRIES, LTD.), and 1 part by weight of 50% propionic carbonate solution of 4,4-bis[di(β-hydroxyethoxy)phenylsulfinio] phenylsulfid-bis-hexafluoroantimonate (photosensitizer) were mixed to prepare a varnish. Subsequently, the varnish was applied to the surface of the insulating base layer including the conductive pattern and the core layer, and was then dried by heating the applied varnish at 80° C. for 15 minutes. Thereafter, the varnish thus heated was exposed to light via a photomask, and was then developed by dissolving an unexposed portion with a gamma-butyrolactone organic solvent. Then, the varnish thus developed was heated at 100° C. for 15 minutes to be cured, thereby forming an insulating cover layer on the insulating base layer so as to expose an external connecting terminal portion, a magnetic-head-side connecting terminal portion, and the supply terminal portion, and to cover a signal wire, the core layer, and the supply terminal portion (cf. FIG. 8(e)).

The insulating cover layer had a refractive index of 1.542 at a wavelength of 830 nm, and had a thickness (thickness from the surface of the core layer) of 10 μm.

Next, an opening having a rectangular shape in plane view was formed in the metal supporting board in a terminal forming portion by wet etching (cf. FIG. 8(f)). The opening had a width of 100 μm and a length of 100 μm.

Subsequently, the insulating base layer, the core layer, and the insulating cover layer were cut at a time from the opening side by laser machining so that the end face of the tip portions thereof intersected the lengthwise direction (cf. FIG. 8(g)). The tilt angle of the end face thus formed by the cutting was 45°.

Thereafter, on the rear end side of a wire portion on the suspension board with circuit, a light emitting device was disposed on the insulating base layer so as to be optically connected with the rear end of the optical waveguide and be electrically connected with the tip of the supply wire.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with circuit comprising:
a metal supporting board;
an insulating base layer formed on the metal supporting board;
a conductive pattern formed on the insulating base layer;
an insulating cover layer formed on the insulating base layer so as to cover the conductive pattern; and
an optical waveguide.

2. The suspension board with circuit according to claim 1, wherein the optical waveguide is provided on the insulating base layer or the insulating cover layer.

3. The suspension board with circuit according to claim 1, wherein
the optical waveguide comprises an under clad layer, a core layer formed on the under clad layer and having a higher refractive index than that of the under clad layer, and an over clad layer formed on the under clad layer so as to cover the core layer and having a lower refractive index than that of the core layer; and
the insulating base layer also serves as the under clad layer, the core layer is formed on the insulating base layer, and the insulating cover layer also serves as the over clad layer.

4. The suspension board with circuit according to any one of claims 1 to 3, further comprising a light emitting device, wherein the light emitting device is optically connected to the optical waveguide.

5. The suspension board with circuit according to claim 4, wherein the optical waveguide is arranged along a direction in which the conductive pattern extends,
the light emitting device is arranged on one side in lengthwise direction of the metal supporting board, and
the mounting portion is arranged on the other side in the lengthwise direction of the metal supporting board.

6. A method for producing a suspension board with circuit, comprising the steps of:
preparing a metal supporting board;
forming an insulating base layer also serving as an under clad layer on the metal supporting board;
forming a conductive pattern on the insulating base layer;
forming a core layer having a higher refractive index than that of the insulating base layer on the insulating base layer; and
forming an insulating cover layer also serving as an over clad layer and having a lower refractive index than that of the core layer on the insulating base layer so as to cover the conductive pattern and the core layer.

* * * * *